United States Patent [19]
Koyama et al.

[11] Patent Number: 5,793,473
[45] Date of Patent: Aug. 11, 1998

[54] PROJECTION OPTICAL APPARATUS FOR PROJECTING A MASK PATTERN ONTO THE SURFACE OF A TARGET PROJECTION OBJECT AND PROJECTION EXPOSURE APPARATUS USING THE SAME

[75] Inventors: Motoo Koyama, Kawasaki; Yutaka Ichihara, Yokohama, both of Japan

[73] Assignee: Nikon Corporation, Japan

[21] Appl. No.: 775,901

[22] Filed: Jan. 2, 1997

Related U.S. Application Data

[63] Continuation of Ser. No. 479,048, Jun. 6, 1995, abandoned.

[30] Foreign Application Priority Data

Jun. 9, 1994 [JP] Japan ................................. 6-127480

[51] Int. Cl.⁶ .......................... G03B 3/00; H01L 21/027
[52] U.S. Cl. ........................ 355/55; 355/53; 359/629
[58] Field of Search ............................. 355/53, 57, 77; 359/629, 631, 637, 638; 250/201.9

[56] References Cited

U.S. PATENT DOCUMENTS

| | | | |
|---|---|---|---|
| 5,142,132 | 8/1992 | MacDonald et al. | 250/201.9 |
| 5,176,970 | 1/1993 | Hawryluk et al. | 430/5 |

*Primary Examiner*—Joan H. Pendegrass
*Attorney, Agent, or Firm*—Pennie & Edmonds LLP

[57] ABSTRACT

A projection exposure apparatus projects the pattern of a reticle at a high resolution even when a wafer which is poor in flatness because of its warping or step is used. An illumination light beam emitted from a light source system illuminates a reticle through a condenser lens. The illumination light beam emerging from the reticle forms the intermediate image of the pattern of the reticle at a position near the reflecting surface of a reflecting mirror through a half prism and a projection lens. The illumination light beam reflected by the reflecting surface forms the pattern image of the reticle onto the surface of a wafer after passing through the projection lens and the half prism again. The shape of the reflecting surface of the reflecting mirror is changed to conform to the shape of the surface of the wafer.

32 Claims, 5 Drawing Sheets

5,793,473

PROJECTION OPTICAL APPARATUS FOR PROJECTING A MASK PATTERN ONTO THE SURFACE OF A TARGET PROJECTION OBJECT AND PROJECTION EXPOSURE APPARATUS USING THE SAME

This is a continuation of application Ser. No. 08/479,048, filed Jun. 6, 1995 now abandoned.

BACKGROUND OF THE INVENTION

1. Field of the Invention

The present invention relates to a projection optical apparatus for projecting a mask pattern onto the surface of a target projection object, which is suitable as an apparatus for projecting the pattern of a reticle or the like onto a photosensitive substrate in a projection exposure apparatus used in a photolithography process for manufacturing a semiconductor element, a liquid crystal display element, or the like.

2. Related Background Art

In a projection exposure apparatus for projecting and exposing the pattern of a reticle or photomask (to be represented by a "reticle" hereinafter) onto a semiconductor wafer (to be simply referred to as a "wafer" hereinafter) coated with a photoresist, or a glass plate, a projection optical system with a high resolution is used. Generally, to increase the resolution, the wavelength of illumination light (exposure light) must be shortened, or the numerical aperture (NA) of the projection optical system must be increased. However, the depth of focus (DOF) of a projected image decreases in proportion to the wavelength of the illumination light while it decreases in inverse proportion to the square of numerical aperture.

In a semiconductor element, the flatness of a wafer used as an exposure target is increased such that the entire shot area on which the pattern of a reticle falls within the range of depth of focus.

Since an exposed wafer is treated through various processes including development, warping occurs through these processes in some cases. To prevent the flatness of the warped wafer from falling out of the range of depth of focus, restrictions are conventionally provided to these processes, thereby suppressing the warping of the wafer within a predetermined allowance.

SUMMARY OF THE INVENTION

It is an object of the present invention to provide a projection optical apparatus capable of exposing, at a high resolution, the pattern of a reticle even onto a wafer which is entirely poor in flatness because of warping or a step.

It is another object of the present invention to provide a projection optical apparatus capable of exposing the pattern of a reticle onto the exposure surface of a wafer at a high resolution even when a projection optical system having a large curvature of field is used.

The above and other objects will become apparent from the following description.

According to the present invention, there is provided a first projection optical apparatus for projecting an image of a mask pattern onto a surface of a target projection object, comprising intermediate image formation means for forming an intermediate image of the mask pattern, reflection means having a reflecting surface substantially arranged at a position where the intermediate image is formed, and re-imaging means for forming the intermediate image of the mask pattern onto the surface of the target projection object again on the basis of a light beam reflected by the reflection means. The reflection means imparts a wavefront aberration (optical path difference) according to a deformed state of the surface of the target projection object to the light beam from the intermediate image formation means.

In this case, the intermediate image formation means may be commonly used as the re-imaging means.

In addition, surface shape detection means for detecting a surface shape of the target projection object and surface shape changing means for changing a shape of the reflecting surface of the reflection means are provided. The surface shape changing means preferably controls the shape of the reflecting surface of the reflection means on the basis of the surface shape of the target projection object, which is detected by the surface shape detection means.

According to the present invention, there is also provided a second projection optical apparatus for projecting an image of a mask pattern onto a surface of a target projection object, comprising intermediate image formation means for forming an intermediate image of the mask pattern onto first and second planes which are different from each other, first and second reflection means respectively having reflecting surfaces substantially arranged on the first and second planes, and re-imaging means for synthesizing light beams reflected by the first and second reflection means and forming the intermediate image onto the surface of the target projection object again on the basis of the synthesized light beam. The first and second reflection means respectively impart wavefront aberrations according to a deformed state of the surface of the target projection object to the light beams from the intermediate image formation means.

According to the first projection optical apparatus of the present invention, the light beam from the mask pattern forms the intermediate image of the mask pattern at a position near the reflecting surface of the reflection means through the intermediate image formation means. The light beam reflected by the reflecting surface forms the intermediate image onto the surface of the target projection object through the re-imaging means. At this time, if the surface of the target projection object has a recessed point, a wavefront aberration (optical path difference) is imparted to the light beam from the intermediate image formation means while setting a point on the reflecting surface, which is conjugate with the recessed point, as a projecting portion. With this operation, the mask pattern is sharply projected even onto the recessed point on the surface.

When the intermediate image formed by the intermediate image formation means has a curvature of field while the surface of the target projection object is flat, the reflecting surface of the reflection means is curved in accordance with the curvature of field. With this operation, the image of the mask pattern is sharply projected onto the surface of the target projection object.

When the intermediate image formation means is commonly used as the re-imaging means, the intermediate image formation means has light beam splitting means such as a half prism and a projection system. The intermediate image of the mask pattern is formed at a position near the reflecting surface of the reflection means through the light beam splitting means and the projection system. The intermediate image is formed onto the surface of the target projection object again through the projection system and the light beam splitting means. In this case, the projection magnification from the mask pattern to the surface is one.

Surface shape detection means for detecting the shape of the surface of the target projection object and surface shape changing means for changing the shape of the reflecting surface of the reflection means are arranged. In this case, when the surface detected by the surface shape detection means is recessed at its center, the surface shape changing means imparts a wavefront aberration (optical path difference) to the light beam from the intermediate image formation means while setting the central portion of the reflecting surface as a projecting portion. Therefore, even when a large number of target projection objects with various surface shapes are sequentially to be exposed, the mask pattern can be exposed onto the surface at a high resolution.

According to the second projection optical apparatus of the present invention, the intermediate image is formed at positions near the two reflecting surfaces. The light beams reflected by the reflecting surfaces are synthesized to form the intermediate onto the surface of the target projection object. At this time, when one of the reflecting surfaces is shifted to be close to the mask pattern with respect to the first plane while the other reflecting surface is shifted to be separated from the mask pattern with respect to the second plane, the image of the mask pattern is formed on first and second projection planes sandwiching the surface of the target projection object. That is, the depth of focus is increased by the double focus effect.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the prior art as described above, the flatness and warping of a wafer used as an exposure target are set to entirely fall within the range of depth of focus of an image projected by a projection optical system. Recently, however, along with a further increase in degree of integration of a VLSI or the like, a higher resolution has been required, resulting in a further decrease in depth of focus. For this reason, it becomes difficult to set the flatness of a wafer within the range of depth of focus.

In addition, as the structure of a semiconductor element is complicated, the treatment processes for a wafer become complex accordingly. Therefore, the warping or step in a wafer tends to become larger through various processes. When the flatness of an entire wafer having such warping or a step falls outside the range of depth of focus, the yield of semiconductor elements to be finally obtained is undesirably decreased.

Furthermore, in some cases, a slight curvature of field remains in a projection optical system. Conventionally, since the exposure field is small, the curvature of field in one shot area on a wafer is small as compared to the range of depth of focus and therefore poses no problem. Recently, however, a projection optical system having a large exposure field is sometimes used to manufacture a large chip pattern. As the exposure field becomes larger, the curvature of field in the periphery becomes larger accordingly. This causes a further decrease in substantial depth of focus when a flat exposure target is used, resulting in a difficulty in maintaining satisfactory imaging characteristics on the entire shot area.

Various embodiments of the present invention will be described below with reference to the accompanying drawings. In the following embodiments, the present invention is applied to a projection exposure apparatus.

[First Embodiment]

Figure 1:
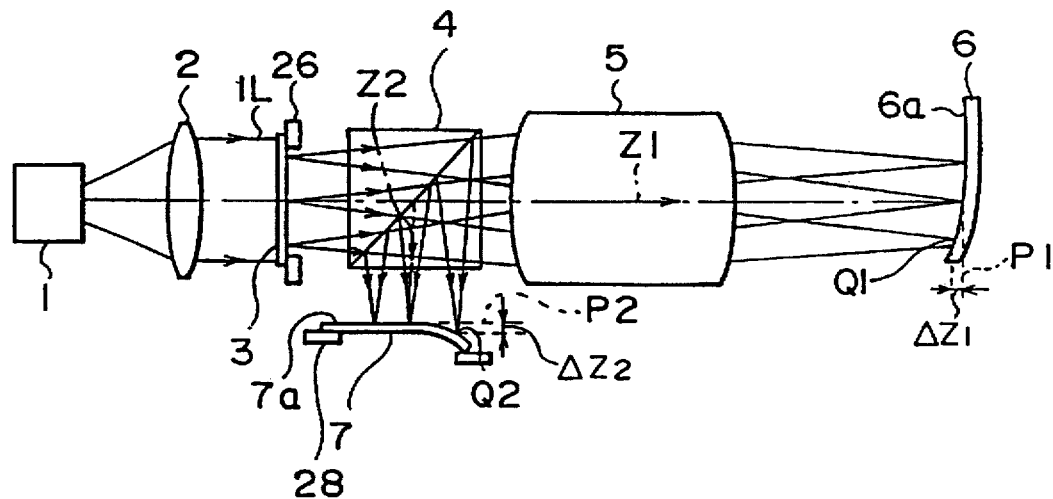
FIG. 1 is a view schematically showing the arrangement of a projection exposure apparatus to which a projection optical apparatus according to the first embodiment of the present invention is applied.

FIG. 1 is a view showing a projection exposure apparatus to which the first embodiment of the present invention is applied. Referring to FIG. 1, a light source system 1 is constituted by an exposure light source such as a mercury lamp or an excimer laser source for emitting illumination light (exposure light), and an optical integrator for forming a large number of secondary sources from the illumination light. An illumination light beam IL emitted from the light source system 1 illuminates the pattern area of a reticle 3 at an almost uniform illuminance distribution through a condenser lens 2. The illumination light beam IL emerging from the reticle 3 is incident on a half prism 4. The illumination light beam transmitted through the half prism 4 forms the intermediate image of the pattern of the reticle 3 onto a first plane P1 near a reflecting surface 6a of a reflecting mirror 6 through a projection lens 5. The reticle 3 is supported by a reticle stage 26.

The pattern formation surface of the reticle 3 is conjugate with the first plane P1. The reflecting surface 6a of the reflecting mirror 6 has a shape with three-dimensional patterns added to the first plane P1 in accordance with the surface shape of a wafer 7 used as an exposure target (to be described later). With this arrangement, a wavefront aberration (optical path difference) is imparted to the light beam from the projection lens 5 at a predetermined distribution. The illumination light beam reflected by the reflecting surface 6a of the reflecting mirror 6 inversely passes through the projection lens 5 toward the half prism 4. The illumination light beam reflected by the half prism 4 forms the pattern image of the reticle 3 onto a shot area on a surface 7a of the wafer 7. A photoresist is coated on the surface 7a of the wafer 7. The wafer 7 is held on a wafer stage 28 for three-dimensionally positioning the wafer 7.

In this case, when a plane conjugate with the first plane P1 with respect to the projection lens 5 and the half prism 4 is defined as a second plane P2, the surface 7a of the wafer 7 is partially shifted from the second plane P2 although the surface 7a of the wafer 7 is averagely set on the second plane P2. An axis Z1 is set parallel to the optical axis of the projection lens 5 while an optical axis obtained upon bending the above optical axis by the half prism 4 is defined as an axis Z2. At this time, assume that a point Q2 on the surface 7a is shifted from the second plane P2 by $\Delta Z_2$ along the axis Z2 (direction to separate from the half prism 4 is defined as positive). The magnification of the projection lens 5 from the reticle 3 to the reflecting mirror 6 is defined as $\beta$, and a point on the reflecting surface 6a of the reflecting mirror 6, which is conjugate with the point Q2 on the wafer 7 is defined as a point Q1. The reflecting surface 6a is deformed such that the position of the point Q1 along the axis Z1 (direction to be close to the projection lens 5 is defined as positive) is shifted by $\Delta Z_1$ which is determined in accordance with the following equations:

$$\Delta Z_2 = 2(1/\beta^2)\Delta Z_1 \qquad (1)$$

$$\Delta Z_1 = (\beta^2/2)\Delta Z_2 \qquad (2)$$

More specifically, when the point Q2 on the surface 7a of the wafer 7 has a deformation amount $\Delta Z_2$, the deformation amount $\Delta Z_1$ corresponding to a value obtained upon multiplying ½ the square of the magnification $\beta$ of the projection lens 5 and the deformation amount $\Delta Z_2$ is added to the point Q1 on the reflecting surface 6a of the reflecting mirror 6, which is conjugate with the point Q2. If the projection lens 5 has a magnification of equal ratio ($\beta=-1$), the deformation about $\Delta Z_1$ of the reflecting surface 6a is ½ the deformation amount $\Delta Z_2$ of the surface 7a of the wafer 7. Subsequently, in accordance with the deformation amounts of different points on the shot area on the surface 7a of the wafer 7, deformation amounts determined by equation (2) are added to the conjugate points on the surface 6a of the reflecting mirror 6. With this operation, an intermediate image formed on the first plane P1, i.e., the pattern image of the reticle 3 is formed again on the entire shot area on the surface 7a of the wafer 7 in an in-focus state.

As described above, according to this embodiment, even when the wafer is warped, as shown in FIG. 1, the pattern image of the reticle 3 can be exposed onto the entire shot area on the surface 7a of the wafer 7 in an in-focus state (at a high resolution) by deforming the reflecting surface 6a of the reflecting mirror 6 so as to conform to the warping of the wafer. As in this embodiment, when the intermediate image and the image on the surface of the wafer 7 are formed by the single projection lens 5, and the intermediate image is approximately flat, at least a side (reflecting mirror 6 side) where the intermediate image is formed is preferably telecentric. If the telecentricity is poor, the light beam reflected by the reflecting mirror 6 is eclipsed in some cases, resulting in a degradation in uniformity of the image formed on the wafer 7 again and uniformity of illuminance of the image.

In this embodiment, the intermediate image and the image on the surface of the wafer 7 are formed by the single projection lens 5. Therefore, the arrangement of the optical system can be simplified although the projection magnification from the reticle 3 to the wafer 7 is one (equal ratio).

In this embodiment, when the projection lens 5 has a curvature of field while the surface of the wafer 7 is flat, the reflecting surface 6a of the reflecting mirror 6 is curved in accordance with the curve of the image projected by the projection lens 5. In this case, when the lens for forming the intermediate image and the lens for forming the image on the wafer 7 are identical, and the curve of the image plane of the intermediate image is large, the principal ray out of the optical axis substantially coincides with the normal (of the corresponding place) of the image plane, preferably. When the surface of the wafer 7 is also warped, the reflecting surface 6a of the reflecting mirror 6 is deformed in accordance with the warping amount. With this operation, even when the projection lens 5 has a curvature of field, or even when the wafer is warped, the pattern image of the reticle 3 can be exposed onto the entire shot area on the surface of the wafer 7 at a high resolution (in an in-focus state).

When the flatness of the reticle 3 is poor, and the patten image of the reticle 3, which is projected by the projection lens 5, is curved, the reflecting surface 6a of the reflecting mirror 6 may be deformed to cancel the curvature. With this operation, the pattern image of the reticle 3 is exposed onto the wafer 7 in an in-focus state.

In this embodiment, all elements from the reticle 3 to the intermediate image are arranged on the same optical axis, and the final image plane is formed on the optical axis bent by the half prism 4. To form the intermediate image and the final image on the same optical axis, the incident light beam from the reticle 3 may be deflected by the half prism 4 and caused to be incident on the projection lens 5.

[Second Embodiment]

Figure 2:
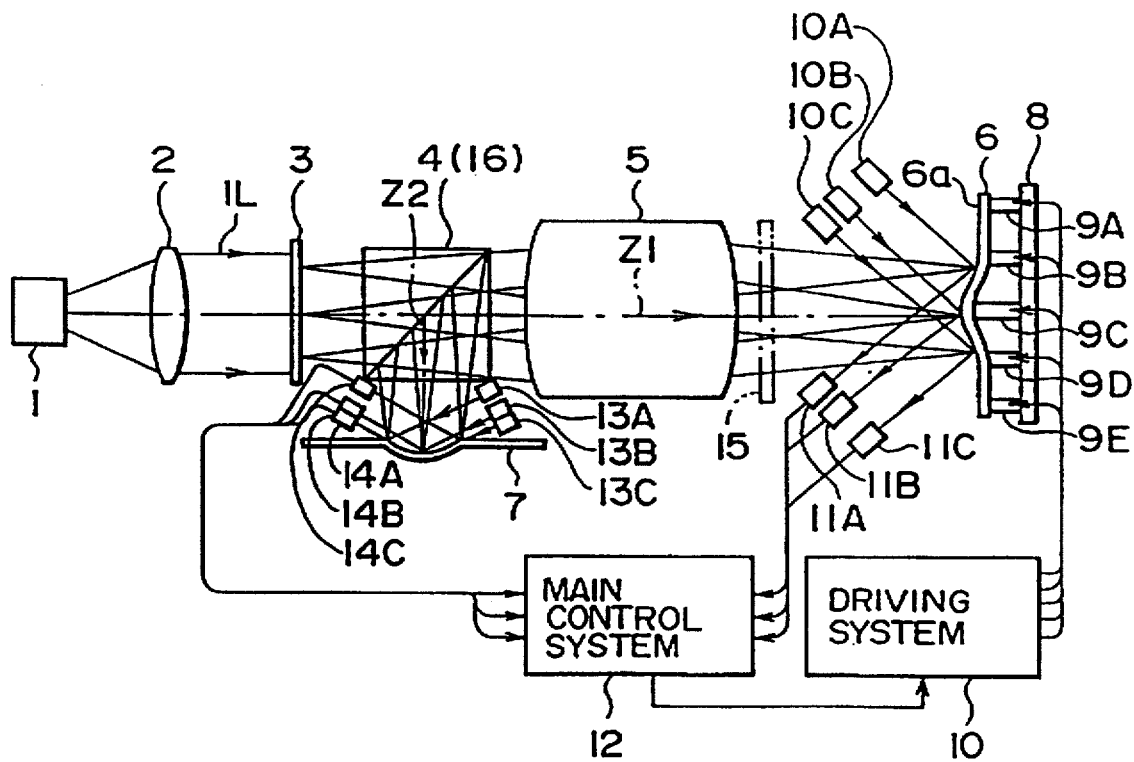
FIG. 2 is a view schematically showing the arrangement of a projection exposure apparatus to which the second embodiment of the present invention is applied.

FIG. 2 is a view showing a projection exposure apparatus to which the second embodiment of the present invention is applied. The same reference numerals as in FIG. 1 denote the same parts in FIG. 2, and a detailed description thereof will be omitted. Referring to FIG. 2, a reflecting mirror 6 which is thin to some extent and can be easily deformed is used. The reflecting mirror 6 is supported on a base 8 through extendible piezoelectric elements 9A to 9E (all piezoelectric elements are represented by the piezoelectric elements 9A to 9E) which are two-dimensionally distributed. The extension/contraction amounts of the piezoelectric elements 9A to 9E are individually controlled by a driving system 10. A reflecting surface 6a of the reflecting mirror 6 is entirely set to a desired shape by pushing/pulling a predetermined portion of the rear surface of the reflecting mirror 6. In place of the piezoelectric elements 9A to 9E, other electrostrictive elements or magnetostrictive elements, or set screw type expansion mechanism can also be used.

A lot of projection optical systems 10A to 10C (all projection optical systems are represented by the projection optical systems 10A to 10C) are two-dimensionally distributed to be oblique with respect to the optical axis of a projection lens 5, which project slit pattern images onto the reflecting surface 6a of the reflecting mirror 6. Light beams reflected by the surface 6a are received by a lot of light-receiving optical systems 11A to 11C (all light-receiving optical systems are represented by the light-receiving optical systems 11A to 11C) which are two-dimensionally distributed. Corresponding slit pattern images are formed again in the light-receiving optical systems 11A to 11C. Focus signals corresponding to the lateral shift amounts of the re-imaging positions are generated and supplied to a main control system 12 for controlling the operation of the entire apparatus. The projection optical systems 10A to 10C and the light-receiving optical systems 11A to 11C constitute an oblique incident type multipoint surface shape detection unit.

Note that the projection optical systems 10A to 10C are not limited to those for projecting slit pattern images.

An oblique incident type multipoint surface shape detection unit is described in, e.g., U.S. Ser. No. 07/964,954 in detail. U.S. Ser.No. 07/964,954 is incorporated in this application as a reference as far as the oblique incident type multipoint surface shape detection unit is concerned.

In the detection mechanism shown in FIG. 2, calibration is performed such that the focus signals are set to zero when the reflecting surface 6a of the reflecting mirror 6 matches the imaging plane of the projection lens 5. When the reflecting surface 6a has a displacement along the direction of axis Z1 parallel to the optical axis of the projection lens 5, the positions of the slit pattern images formed in the light-receiving optical systems 11A to 11C are laterally shifted to change the focus signals. Therefore, the main control system 12 can calculate the distribution of the three-dimensional patterns on the reflecting surface 6a.

Similarly, to measure the distribution of the three-dimensional patterns on the surface of the wafer 7, projection optical systems 13A to 13C and light-receiving optical systems 14A to 14C are arranged in correspondence with the projection optical systems 10A to 10C and the light-receiving optical systems 11A to 11C, and focus signals from the light-receiving optical systems 14A to 14C are supplied to the main control system 12. In this case, the focus signals change in correspondence with the displacement of the surface of the wafer 7, which is caused along an axis Z2 obtained upon bending the optical axis of the projection lens 5 by a half prism 4. In accordance with the focus signals, the main control system 12 calculates the distribution of the three-dimensional patterns on the surface of the wafer 7 with respect to the imaging plane by the projection lens 5 and the half prism 4.

In this embodiment, before exposure, the main control system 12 calculates the distribution of the shift amounts of the surface shape of the wafer 7 from the imaging plane by using the focus signals from the light-receiving optical systems 14A to 14C. The extension/contraction amounts of the piezoelectric elements 9A to 9E are adjusted through the driving system 10 in accordance with the distribution of the shift amounts. The distribution of the shift amounts of the shape of the reflecting surface 6a of the reflecting mirror 6 from the image formation plane, which is calculated using the focus signals from the light-receiving optical systems 11A to 11C, is set to the relation of equation (2) with respect to the distribution of the shift amounts of the surface shape of the wafer 7. Thereafter, an illumination light beam IL is emitted from a light source system 1 to expose the pattern image of a reticle 3 onto the surface of the wafer 7. With this operation, even when the wafer 7 is warped, the pattern image of the reticle 3 can be exposed onto the entire shot area on the surface of the wafer 7 at a high resolution (in an in-focus state).

When the projection lens 5 has a curvature of field, or when the flatness of the reticle 3 is poor, a displacement corresponding to the shape of the reflecting surface 6a of the reflecting mirror 6 is superposed. With this operation, the pattern image of the reticle 3 can be exposed onto the entire shot area on the surface of the wafer 7 in an in-focus state.

The half prism 4 is used in the embodiments shown in FIGS. 1 and 2. Since the illumination light beam IL passes through the half prism 4 twice, about 75% of the illumination light beam IL transmitted through the reticle 3 is lost. To decrease such a loss in light amount, as shown in FIG. 2, the half prism 4 may be replaced with a polarization beam splitter 16, and at the same time, a λ/4 plate 15 may be arranged between the projection lens 5 and the reflecting mirror 6. With this arrangement, when the illumination light beam IL for illuminating the reticle 3 is in a randomly polarized state, a P-polarized light component corresponding to about 50% of the illumination light beam IL passes through the polarization beam splitter 16. This P-polarized light component is returned to the polarization beam splitter 16 as S-polarized light through the projection lens 5, the λ/4 plate 15, the reflecting mirror 6, the λ/4 plate 15, and the projection lens 5. Almost 100% of this S-polarized light component is reflected toward the wafer 7. Therefore, the loss in light amount can be decreased to about 50%.

In addition, ghost light (stray light) in the projection lens 5 can also be removed by the polarization beam splitter 16. The λ/4 plate 15 can be inserted anywhere in the optical path as far as it is located on the intermediate image side (reflecting mirror 6 side) with respect to the polarization beam splitter 16. However, to effectively remove the ghost light in the projection lens 5, the λ/4 plate 15 is preferably inserted on the intermediate image side with respect to the projection lens 5.

In all embodiments, a back reflecting mirror having a rear surface as a reflecting surface is preferably used as the reflecting mirror 6 or 20. The reason for this is as follows. The reflecting mirror 6 or 20 is arranged at the image position. Therefore, if dust sticks to the reflecting surface of the reflecting mirror 6 or 20, the image quality is largely adversely affected. When a back reflecting mirror is used as the reflecting mirror 6 or 20, dust sticking to the surface is defocused, thereby minimizing the influence on the image quality.

Figure 3:
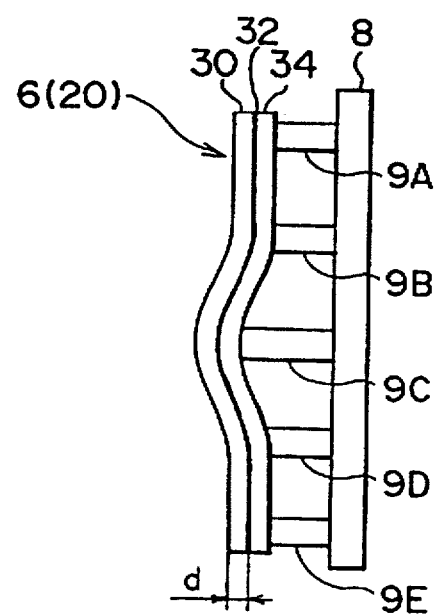
FIG. 3 is a side view showing a back reflecting mirror having a rear surface as a reflecting surface.

FIG. 3 is a side view showing a back reflecting mirror having a rear surface as a reflecting surface. A reflecting film 32 is formed on the rear surface of a transparent member 30 as of glass or the like, i.e., a surface opposite to the light beam incident side. The transparent member 30 is attached to the piezoelectric elements 9A to 9E through a support member 34. The support member 34 is preferably formed of glass. Note that, when a back reflecting mirror is to be used as the reflecting mirror 6 or 20, the projection lens 5 must be designed and manufactured in consideration of a spherical aberration and a coma according to a thickness d (FIG. 3) of the transparent member 30.

[Third Embodiment]

Figure 4:
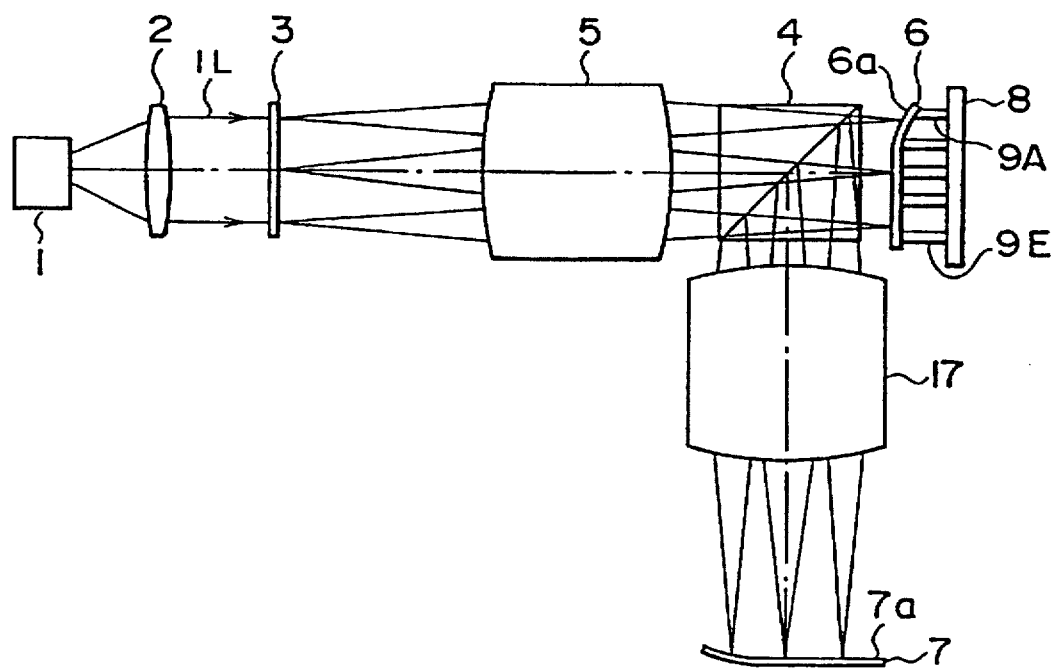
FIG. 4 is a view schematically showing the arrangement of a projection exposure apparatus to which the third embodiment of the present invention is applied.

FIG. 4 is a view showing a projection exposure apparatus to which the third embodiment of the present invention is applied. The same reference numerals as in FIG. 2 denote the same parts in FIG. 4, and a detailed description thereof will be omitted. Referring to FIG. 4, a half prism 4 is arranged on a reflecting mirror 6 side (intermediate image side) with respect to a projection lens 5, and a projection lens 17 serving as a final imaging lens is arranged between the half prism 4 and a wafer 7. In this case, an illumination light beam passing through a reticle 3 forms the intermediate image of the reticle 3 to a portion near a reflecting surface 6a of the reflecting mirror 6 through the projection lens 5 and the half prism 4. The illumination light beam reflected by the reflecting mirror 6 is reflected by the half prism 4, and thereafter, forms the intermediate image onto a surface 7a of the wafer 7 again through the projection lens 17. The function of the reflecting mirror 6 is the same as that in the first and second embodiments.

In this embodiment, the projection lenses 5 and 17 are respectively used for intermediate image formation and final image formation. For this reason, the ratio of the size of the pattern of the reticle 3 to that of the image projected onto the wafer 7 can be set to a desired value other than one. More specifically, when the magnification of the projection lens 5 from the reticle 3 to the reflecting mirror 6 is defined as β, and the magnification of the projection lens 17 from the reflecting mirror 6 to the wafer 7 is defined as $β_2$, the magnification from the reticle 3 to the wafer 7 is represented by $β·β_2$.

In this embodiment, the projection lenses 5 and 17 need not always be telecentric. In addition, as in the second embodiment shown in FIG. 2, a polarization beam splitter 16 may be used in place of the half prism 4, and a λ/4 plate 15 may be inserted in the optical path on the intermediate image side with respect to the polarization beam splitter 16. With this arrangement, the loss in light amount can be decreased.

[Fourth Embodiment]

Figure 5:
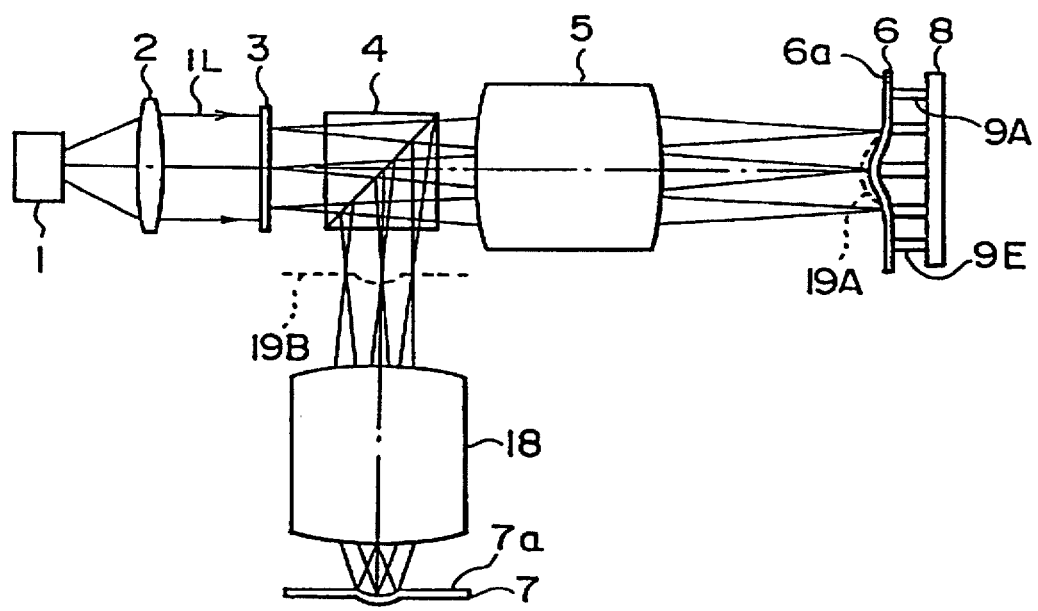
FIG. 5 is a view schematically showing the arrangement of a projection exposure apparatus to which the fourth embodiment of the present invention is applied.

FIG. 5 is a view showing a projection exposure apparatus to which the fourth embodiment of the present invention is applied. The same reference numerals as in FIG. 2 denote the same parts in FIG. 5, and a detailed description thereof will be omitted. Referring to FIG. 5, the intermediate image of the pattern of a reticle 3 is formed onto an imaging plane 19B again by an illumination light beam reflected by a half prism 4. A variable magnification lens 18 and a wafer 7 are sequentially arranged below the imaging plane 19B, and the intermediate image on the imaging plane 19B is formed onto a surface 7a of the wafer 7 again through the projection lens 18. The variable magnification lens 18 is a projection lens capable of changing the magnification while fixing the object plane and the imaging plane. Note that a projection lens having a predetermined fixed magnification may be used in place of the variable magnification lens 18.

In this embodiment, a reflecting mirror 6 has the same function as that in the above embodiments such that the shape of a reflecting surface 6a of the reflecting mirror 6 is changed in accordance with warping of the surface 7a of the wafer 7. With this arrangement, the first intermediate image of the reticle 3 is formed onto an imaging plane 19A consisting of a curved surface near the reflecting surface 6a. The second intermediate image is formed onto the imaging plane 19B consisting of a curved surface conjugate with the image formation plane 19A with respect to a projection lens 5 and the half prism 4. The final image is formed onto the surface 7a of the wafer 7, which matches a curved surface conjugate with the imaging plane 19B with respect to the variable magnification lens 18. Therefore, the pattern image of the reticle 3 is projected and exposed onto the surface of the wafer 7 in an in-focus state.

In this embodiment, the pattern of the reticle 3 can be projected onto the wafer 7 at a desired magnification by the variable magnification lens 18. In this embodiment as well, as in the second embodiment shown in FIG. 2, a polarization beam splitter 16 may be used in place of the half prism 4, and a λ/4 plate 15 may be inserted in the optical path. The λ/4 plate 15 can be inserted anywhere in the optical path as far as it is located on the first intermediate image side (reflecting mirror 6 side) with respect to the polarization beam splitter 16. However, to obtain the effect of removing ghost light in the projection lens 5, the λ/4 plate 15 is preferably inserted on the first intermediate image side with respect to the projection lens 5.

[Fifth Embodiment]

Figure 6:
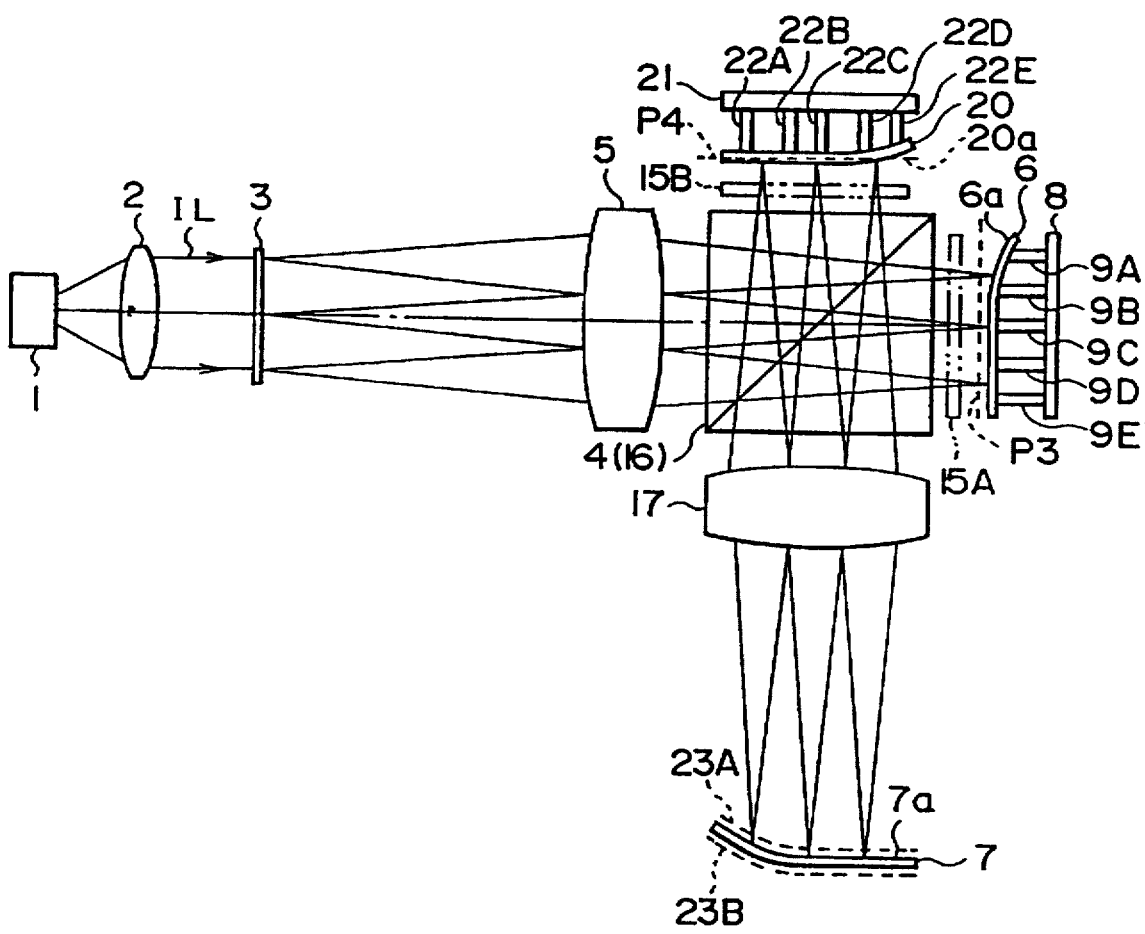
FIG. 6 is a view schematically showing the arrangement of a projection exposure apparatus to which the fifth embodiment of the present invention is applied.

FIG. 6 is a view showing a projection exposure apparatus to which the fifth embodiment of the present invention is applied. The same reference numerals as in FIG. 4 denote the same parts in FIG. 6, and a detailed description thereof will be omitted. In the embodiment shown in FIG. 4, the illumination light incident from the projection lens 5 onto the half prism 4 and reflected by the half prism 4 is lost. To prevent this, in this embodiment, a reflecting surface 20a of a reflecting mirror 20 is arranged bear a plane P4 on which the intermediate image of a reticle 3 is formed by an illumination light beam reflected by a half prism 4, as shown in FIG. 6. The reflecting mirror 20 is supported on a base 21 through piezoelectric elements 22A to 22E (all piezoelectric elements are represented by the piezoelectric elements 22A to 22E) which are two-dimensionally distributed. Three-dimensional patterns on the reflecting surface 20a of the reflecting mirror 20 are set in a desired distribution by pushing/pulling the rear surface of the reflecting mirror 20 by the piezoelectric elements 22A. to 22E. A reflecting surface 6a of a reflecting mirror 6 is arranged near a plane P3 on which the intermediate image of the reticle 3 is formed by the illumination light beam transmitted through the half prism 4.

In this case, a light component of the illumination light beam reflected by the reflecting mirror 6, which is reflected by the half prism 4, and a light component of the illumination light beam reflected by the reflecting mirror 20, which is transmitted through the half prism 4, are synthesized to form the pattern image of the reticle 3 onto a surface 7a of a wafer 7 through a projection lens 17. The function of the reflecting mirror 6 is the same as that in the above embodiments, and the function of the reflecting mirror 20 is the same as that of the reflecting mirror 6. In this embodiment, the illumination light beam reflected by the half prism 4, i.e., the light beam lost in the third embodiment can be effectively used. As a result, in this embodiment, a light amount about twice that in the third embodiment can be obtained.

In the third embodiment shown in FIG. 4, the final imaging plane is conjugate with the surface of the reflecting mirror 6. For this reason, dust or flaws on the reflecting surface of the reflecting mirror 6 tend to be transferred onto the final imaging plane (surface of the wafer 7). To the contrary, in this embodiment shown in FIG. 6, the two reflecting mirrors 6 and 20 are used. Therefore, the image of dust or flaws on one reflecting mirror can be canceled by the image of the other reflecting mirror, thereby minimizing the influence of the dust or flaws on the surfaces of the reflecting mirrors 6 and 20.

In addition, as shown in FIG. 6, the reflecting surface 6a of the reflecting mirror 6 is set at a position to be separated from the projection lens 5 with respect to the imaging plane P3 along the optical axis of the projection lens 5 so as not to largely exceed the depth of focus. At this time, the reflecting surface 20a of the reflecting mirror 20 may be set at a position to be close to the projection lens 5 with respect to the imaging plane P4 along the optical axis of the projection lens 5 so as not to largely exceed the depth of focus. In this manner, an offset may be provided between the positions of the two reflecting surfaces 6a and 20a. With this arrangement, the pattern image of the reticle 3 is formed on two planes 23A and 23B arranged to sandwich the surface 7a of the wafer 7 along the optical axis of the projection lens 17. Therefore, the same effect as in projection through a double focus lens can be obtained on the surface 7a of the wafer 7, thereby substantially increasing the depth of focus of the projected image.

Since the half prism 4 is used in the arrangement shown in FIG. 6, a loss of about 50% is caused in light amount by the half prism 4. To prevent this, the half prism 4 in FIG. 6 can be replaced with a polarization beam splitter 16, and λ/4 plates 15A and 15B can be respectively arranged between the polarization beam splitter 16 and the reflecting mirror 6 and between the polarization beam splitter 16 and the reflecting mirror 20.

In this case, a P-polarized light component transmitted through the polarization beam splitter 16 is returned to the polarization beam splitter 16 as S-polarized light through the λ/4 plate 15A, the reflecting mirror 6, and the λ/4 plate 15A. Almost 100% of the S-polarized light component is reflected toward the projection lens 17. On the other hand, an S-polarized light component reflected by the polarization beam splitter 16 is returned to the polarization beam splitter 16 as P-polarized light through the λ/4 plate 15B, the reflecting mirror 20, and the λ/4 plate 15B. Almost 100% of the P-polarized light component is transmitted toward the projection lens 17. Therefore, the loss in light amount caused by optical path splitting in the polarization beam splitter 16 can be decreased to almost zero.

[Sixth Embodiment]

Figure 7:
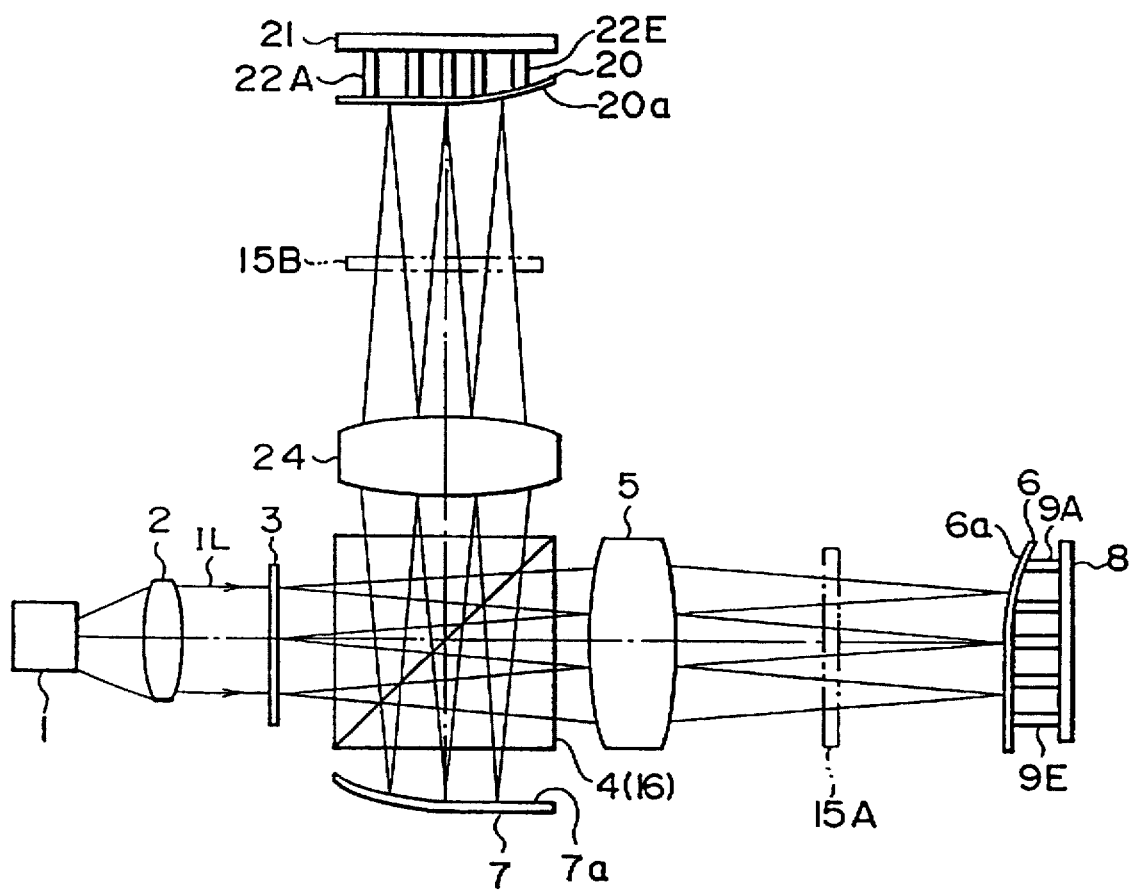
FIG. 7 is a view schematically showing the arrangement a projection exposure apparatus to which the sixth embodiment of the present invention is applied.

FIG. 7 is a view showing a projection exposure apparatus to which the sixth embodiment of the present invention is applied. The same reference numerals as in FIGS. 2 and 6 denote the same parts in FIG. 7, and a detailed description thereof will be omitted. In the embodiment shown in FIG. 2, a light component of the illumination light incident on the half prism 4, which is reflected by the half prism 4, is lost. To prevent this, in this embodiment shown in FIG. 7, a second projection lens 24 identical to a projection lens 5 and a second reflecting mirror 20 are sequentially arranged to be symmetrical to a wafer 7 with respect to the half prism 4. A reflecting surface 20a of the reflecting mirror 20 is set near a position where the illumination light beam reflected by the half prism 4 forms the intermediate image of a reticle 3 through the projection lens 24.

In this case, a light component of the illumination light beam reflected by the reflecting mirror 20, which is returned to the half prism 4 through the projection lens 24 again and transmitted through the half prism 4, and a light component reflected by a reflecting mirror 6, returned to the half prism 4 through the projection lens 5, and reflected by the half prism 4 form the pattern image of the reticle 3 on a surface 7a of the wafer 7. The function of the reflecting mirror 6 is the same as that in the second embodiment, and the function of the reflecting mirror 20 is the same as that of the reflecting mirror 6.

In this embodiment, the second projection lens 24 is arranged on the optical axis of the light beam reflected and split by the half prism 4 while the second reflecting mirror 20 is arranged near the image plane. For this reason, the light beam lost in the second embodiment can be effectively used. As a result, in this embodiment, a light amount about twice that in the second embodiment can be obtained on the surface of the wafer 7. In addition, with this arrangement, the influence of dust or flaws on the reflecting mirrors 6 and 20 can be minimized, as in the embodiment shown in FIG. 6. Furthermore, when an offset is provided along the optical axis of the projection lens in correspondence with the position of the reflecting mirror 6 or 20, the depth of focus can be substantially increased.

Since the half prism 4 is used in the embodiment shown in FIG. 7, a loss of about 50% is caused in light amount by the half prism 4. To prevent this, a polarization beam splitter 16 may be arranged in place of the half prism 4, a first λ/4 plate 15A may be arranged between the projection lens 5 and the reflecting mirror 6, and a second λ/4 plate 15B may be arranged between the projection lens 24 and the reflecting mirror 20. With this arrangement, the loss in light amount, which is caused by optical path branching in the polarization beam splitter 16 can be decreased to almost zero.

The λ/4 plates 15A and 15B can be inserted anywhere in the optical path as far as they are located on the intermediate image side with respect to the polarization beam splitter 16. However, to obtain the effect of removing ghost light in the projection lenses 5 and 24, the λ/4 plates 15A and 15B are preferably inserted on the intermediate image side with respect to the projection lenses 5 and 24, respectively.

In each of the above embodiments, the final imaging plane is almost conjugate with the reflecting mirror. For this reason, in, e.g., FIG. 1, dust or flaws on the reflecting surface of the reflecting mirror 6 tend to be transferred onto the surface of the wafer 7, which corresponds to the final image formation plane. The reflecting mirror 6 may be arranged with an offset with respect to the final imaging plane along the optical axis (direction of axis Z1) within a range not to adversely affect the aberrations and the field variable effect. With this arrangement, the influence of dust or flaws can be minimized.

In addition, in the embodiment shown in FIG. 2, the oblique incident type multipoint surface shape detection mechanism is used to control the shape of the surface 6a of the reflecting mirror 6 in a closed-loop system. However, since the extension/contraction amounts of the piezoelectric elements 9A to 9E are almost the same as the displacement amount of the surface 6a, the shape of the surface 6a may be controlled in an open-loop system.

Furthermore, the illumination light beam passing through the reticle 3 may be detected by an image point detection unit arranged at the position of the final imaging plane (surface of the wafer 7), thereby obtaining the shape of the image formation plane. With this arrangement, the shape of the reflecting surface of the reflecting mirror 6 may be controlled by closed-loop control in which a signal detected by the image point detection unit is fed back to a surface shape control unit.

In the embodiment shown in FIG. 1, the shape of the imaging plane by the projection lens 5 and the half prism 4 can be set to an arbitrary curved surface in accordance with the shape of the reflecting surface 6a of the reflecting mirror 6. Therefore, when the pattern of the reticle 3 is to be exposed onto not the wafer 7 but a target transfer object having a surface shape other than a planar shape, e.g., a wafer having a spherical surface (spherical wafer), or a spherical liquid crystal substrate having a spherical surface, the shape of the reflecting surface 6a is set to a corresponding shape. With this operation, the pattern of the reticle 3 can be exposed onto the entire surface of the target transfer object at a high resolution.

As has been described above, the projection optical apparatus of the present invention can be applied to a projection exposure apparatus, and particularly, to a so-called stepper for performing projection and exposure by a step-and-repeat method. A projection exposure apparatus is described in, e.g., U.S. Ser. No. 08/397,506 in detail. The U.S. Ser. No. 08/397,506 is incorporated in this application as a reference as far as the projection exposure apparatus is concerned.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.127480/1994 filed on Jun. 9, 1994 is hereby incorporated by reference.

What is claimed is:

1. A projection optical apparatus for projecting an image of a pattern on one of a reticle and a mask onto a surface of a target projection object, comprising:

an intermediate image formation optical system for forming an intermediate image of the pattern;

reflecting means having a reflecting surface arranged near a position where the intermediate image is formed; and a re-imaging optical system for forming the intermediate image of said pattern onto said surface of said target projection object again on the basis of a light beam reflected by said reflecting means, wherein said reflecting means imparts a wavefront aberration according to a deformed state of said surface of said target projection object to the light beam from said intermediate image formation optical system by deforming said reflecting surface.

2. An apparatus according to claim 1, wherein a deformation amount $\Delta Z_1$ of said reflecting surface is represented by the following equation:

$$\Delta Z_1 = (\beta^2/2) \cdot \Delta Z_2$$

where $\Delta Z_2$ is a deformation amount of said surface of said target projection object, and $\beta$ is a magnification of said re-imaging optical system from said target projection object to the position where the intermediate image is formed.

3. An apparatus according to claim 1, further comprising a first surface shape detection unit for detecting a deformed state of said reflecting surface.

4. An apparatus according to claim 3, wherein said first surface shape detection unit comprises a projection optical system for projecting a predetermined pattern image from a direction oblique with respect to said reflecting surface, and a light-receiving optical system for receiving the light beam emerging from said projection optical system and reflected by said reflecting surface.

5. An apparatus according to claim 1, further comprising a second surface shape detection unit for detecting the deformed state of said surface of said target projection object.

6. An apparatus according to claim 5, wherein said second surface shape detection unit comprises a projection optical system for projecting a predetermined pattern image from a direction oblique with respect to said surface of said target projection object, and a light-receiving optical system for receiving the light beam emerging from said projection optical system and reflected by said surface of said target projection object.

7. An apparatus according to claim 1, further comprising a surface shape changing unit for changing a shape of said reflecting surface of said reflecting means.

8. An apparatus according to claim 7, wherein said surface shape changing unit has an extendible piezoelectric element.

9. An apparatus according to claim 1, wherein said intermediate image formation optical system has a half mirror for splitting the light beam from said pattern on one of said reticle and said mask by transmitting part of the light beam and reflecting a remainder and a projection optical system for projecting the light beam split by said half mirror onto said reflecting means, and said re-imaging optical system has said projection optical system for projecting the light beam reflected by said reflecting means toward said half mirror, and said half mirror for guiding the light beam from said projection optical system onto said surface of said target projection object.

10. An apparatus according to claim 9, wherein said projection optical system is telecentric on said reflecting means side.

11. An apparatus according to claim 1, wherein said intermediate image formation optical system has a polarization beam splitter for splitting the light beam from said pattern on one of said reticle and said mask by transmitting part of the light beam and reflecting a remainder, a projection optical system for projecting the light beam split by said polarization beam splitter onto said reflecting means, and a $\lambda/4$ plate arranged between said polarization beam splitter and said reflecting means, and said re-imaging optical system has said projection optical system for projecting the light beam reflected by said reflecting means toward said polarization beam splitter, said polarization beam splitter for guiding the light beam from said projection optical system onto said surface of said target projection object, and said $\lambda/4$ plate.

12. An apparatus according to claim 11, wherein said $\lambda/4$ plate is arranged between said projection optical system and said reflecting means.

13. An apparatus according to claim 11, wherein said projection optical system is telecentric on said reflecting means side.

14. An apparatus according to claim 1, wherein said intermediate image formation optical system has a first projection optical system for projecting the light beam from said pattern on one of said reticle and said mask onto a position near said reflecting surface of said reflecting means, and a half mirror for splitting the light beam from said first projection optical system by transmitting part of the light beam and reflecting a remainder, and said re-imaging optical system has said half mirror for guiding the light beam reflected by said reflecting means onto said surface of said target projection object, and a second projection optical system for projecting the light beam from said half mirror onto said surface of said target projection object.

15. An apparatus according to claim 1, wherein said intermediate image formation optical system has a first projection optical system for projecting the light beam from said pattern on one of said reticle and said mask onto a position near said reflecting surface of said reflecting means, a polarization beam splitter for splitting the light beam from said first projection optical system by transmitting part of the light beam and reflecting a remainder, and a $\lambda/4$ plate arranged between said polarization beam splitter and said reflecting means, and said re-imaging optical system has said polarization beam splitter for guiding the light beam reflected by said reflecting means onto said surface of said target projection object, a second projection optical system for projecting the light beam from said polarization beam splitter onto said surface of said target projection object, and said $\lambda/4$ plate.

16. An apparatus according to claim 1, further comprising a variable magnification optical system for changing a size of the image formed onto said target projection object again.

17. An apparatus according to claim 1, wherein each of said intermediate image formation optical system, said reflecting means, and said image formation optical system is constituted by two systems, a first intermediate image formation optical system has a half mirror for transmitting part of the light beam from said pattern on one of said reticle and said mask and reflecting a remainder, and a first projection optical system for forming a first intermediate image at a position near a reflecting surface of first reflecting means in accordance with the light beam transmitted through said half mirror, a first re-imaging optical system has said first projection optical system for projecting the light beam reflected by said first reflecting means toward said half mirror, and said half mirror for reflecting the light beam from said first projection optical system to form the image onto said surface of said target projection object again, a second intermediate image formation optical system has said half mirror, and a second projection optical system for forming a second intermediate image at a position near a reflecting surface of second reflecting means in accordance with part of the light beam from said pattern on one of said reticle and said mask, which is reflected by said half mirror, and a second re-imaging optical system has said second projection optical system for projecting the light beam reflected by said second reflecting means toward said half mirror, and said half mirror for transmitting the light beam from said second projection optical system to form the image onto said surface of said target projection object again.

18. An apparatus according to claim 17, wherein a position of the image formed by said first re-imaging optical system again is shifted with respect to a position of the image formed by said second re-imaging optical system again.

19. An apparatus according to claim 1, wherein each of said intermediate image formation optical system, said reflecting means, and said image formation optical system is constituted by two systems, a first intermediate image formation optical system has a polarization beam splitter for transmitting part of the light beam from said pattern on one of said reticle and said mask and reflecting a remainder, a first projection optical system for forming a first intermediate image at a position near a reflecting surface of first reflecting means in accordance with the light beam transmitted through said polarization beam splitter, and a first λ/4 plate arranged between said polarization beam splitter and said first reflecting means, a first re-imaging optical system has said first projection optical system for projecting the light beam reflected by said first reflecting means toward said polarization beam splitter, said polarization beam splitter for reflecting the light beam from said first projection optical system so as to form the image onto said surface of said target projection object again, and said λ/4 plate, a second intermediate image formation optical system has said polarization beam splitter, a second projection optical system for forming a second intermediate image at a position near a reflecting surface of second reflecting means in accordance with part of the light beam from said pattern on one of said reticle and said mask, which is reflected by said polarization beam splitter, and a second λ/4 plate arranged between said polarization beam splitter and said second reflecting means, and a second re-imaging optical system has said second projection optical system for projecting the light beam reflected by said second reflecting means toward said polarization beam splitter, said polarization beam splitter for transmitting the light beam from said second projection optical system to form the image onto said surface of said target projection object again, and said second λ/4 plate.

20. An apparatus according to claim 19, wherein a position of the image formed by said first re-imaging optical system again is shifted with respect to a position of the image formed by said second re-imaging optical system again.

21. An apparatus according to claim 1, wherein each of said intermediate image formation optical system, said reflecting means, and said image formation optical system is constituted by two systems, a first intermediate image formation optical system has a first projection optical system for projecting the light beam from said pattern on one of said reticle and said mask, and a half mirror for transmitting part of the light beam from said first projection optical system and reflecting a remainder, said half mirror transmitting the light beam to form a first intermediate image at a position near a reflecting surface of first reflecting means, a first re-imaging optical system has said half mirror for reflecting the light beam reflected by said first reflecting means, and a second projection optical system for forming the image of the light beam reflected by said half mirror onto said surface of said target projection object again, a second intermediate image formation optical system has said first projection optical system, and said half mirror for reflecting the light beam to form a second intermediate image at a position near a reflecting surface of second reflecting means, and a second re-imaging optical system has said half mirror for transmitting the light beam reflected by said second reflecting means, and said second projection optical system for forming the image of the light beam transmitted through said half mirror onto said surface of said target projection object again.

22. An apparatus according to claim 21, wherein a position of the image formed by said first re-imaging optical system again is shifted with respect to a position of the image formed by said second re-imaging optical system again.

23. An apparatus according to claim 1, wherein each of said intermediate image formation optical system, said reflecting means, and said image formation optical system is constituted by two systems, a first intermediate image formation optical system has a first projection optical system for projecting the light beam from said pattern on one of said reticle and said mask, a polarization beam splitter for transmitting part of the light beam from said first projection optical system and reflecting a remainder, said polarization beam splitter transmitting the light beam to form a first intermediate image at a position near a reflecting surface of first reflecting means, and a first λ/4 plate arranged between said polarization beam splitter and said first reflecting means, a first re-imaging optical system has said polarization beam splitter for reflecting the light beam reflected by said first reflecting means, a second projection optical system for forming the image of the light beam reflected by said polarization beam splitter onto said surface of said target projection object again, and said first λ/4 plate, a second intermediate image formation optical system has said first projection optical system, said polarization beam splitter for reflecting the light beam to form a second intermediate image at a position near a reflecting surface of second reflecting means, and a second λ/4 plate arranged between said polarization beam splitter and said second reflecting means, and a second re-imaging optical system has said polarization beam splitter for transmitting the light beam reflected by said second reflecting means, said second projection optical system for forming the image of the light beam transmitted through said polarization beam splitter onto said surface of said target projection object again, and said second λ/4 plate.

24. An apparatus according to claim 23, wherein a position of the image formed by said first re-imaging optical system again is shifted with respect to a position of the image formed by said second re-imaging optical system again.

25. An apparatus according to claim 1, wherein said reflecting means comprises a transparent member consisting of a transparent material, and a reflecting film, formed on a surface opposite to a light beam incident side of said transparent member, for reflecting the incident light beam.

26. A projection exposure apparatus for projecting and exposing an image of a pattern on one of a reticle and a mask onto a surface of a photosensitive substrate, comprising:

an illumination optical system;

a first stage, arranged so that one of said reticle and said mask receives an illumination light from said illumination optical system, for supporting one of said reticle and said mask;

an intermediate image formation optical system, arranged so as to receive a light beam from one of said reticle and said mask, for forming an intermediate image of said pattern on the basis of the light beam from one of said reticle and said mask;

reflector having a reflecting surface arranged near a position where the intermediate image is formed;

a re-imaging optical system, arranged so as to receive a light beam reflected by said reflector, for forming the intermediate image of said pattern onto said surface of said photosensitive substrate again on the basis of the light beam reflected by said reflector; and a second stage, arranged so that said photosensitive substrate receives a light beam from said re-imaging optical system, for supporting said photosensitive substrate;

wherein said reflector imparts a wavefront aberration according to a deformed state of said surface of said photosensitive substrate to the light beam from said intermediate image formation optical system by deforming said reflecting surface.

27. A method for fabricating a semiconductor device, comprising:

a step of emitting an illumination light;

a step of illuminating a circuit pattern on one of a mask and a reticle based on said illumination light;

a step of forming an intermediate image based on the illumination light passing through one of said mask and said reticle;

a step of reflecting the illumination light by a reflector arranged substantially at a position where said intermediate image is formed; and a step of forming a secondary image of said circuit pattern on a photosensitive substrate based on the light reflected by said reflector, wherein said secondary image is formed by light from said intermediate image, a total image is formed by light from said secondary image, and said circuit pattern is transferred from one of said mask and said reticle to said photosensitive substrate by a singular step.

28. A method according to claim 27, further comprising:

a step of measuring an aberration at a position of said photosensitive substrate, and a step of transforming said reflector based on the measured aberration.

29. A projection exposure apparatus for projecting and transferring an image of a pattern on one of a reticle and a mask onto a photosensitive substrate, comprising:

a light source;

an illumination optical system;

a first stage;

a second stage;

a first refraction optical system;

a deformable mirror; and a second refraction optical system, wherein said light source, said illumination optical system, said first and first and second stages, said first and second refraction optical systems and said deformable mirror are so arranged that light from said light source passes through said illumination optical system, passes through one of said reticle and mask supported by said first stage, passes through said first refraction optical system, then the light from said light source is reflected by said deformable mirror, passes through said second refraction optical system, reaches said photosensitive substrate supported by said second stage, said first refraction optical system forms a primary image of the pattern of one of said reticle and said mask near said deformable mirror by using light from one of said reticle and said mask, said second refraction optical system forms a secondary image of said pattern of one of said reticle and said mask on said photosensitive substrate by using light from said primary image, and said pattern is transferred from one of said reticle and said mask to said photosensitive substrate by a singular step.

30. A projection exposure apparatus according to claim 29, wherein said first refraction optical system coincides with said second refraction optical system.

31. A projection exposure apparatus according to claim 29, wherein a polarization beam splitter is arranged in a light path between said deformable mirror and one of said reticle and said mask, and a λ/4 plate is arranged in a light path between said polarization beam splitter and said deformable mirror.

32. A method of manufacturing a projection type exposure apparatus which performs the projection-transfer of a pattern image on either one of a reticle and a mask, on a photosensitive substrate, said method comprising the steps of:

preparing an illumination optical system including a light source;

preparing a first stage supporting either one of said reticle and said mask;

preparing an intermediate image forming optical system for forming an intermediate image of said pattern image based on light passing through said illumination optical system;

arranging a deformable mirror in adjacent to a position at which said intermediate image is formed; and preparing re-imaging optical system for forming an image of said intermediate image on said photosensitive substrate based on light reflected by said deformable mirror, wherein said intermediate image forming optical system, said deformable mirror and said re-imaging optical system are arranged so that said pattern image is formed on said photosensitive substrate at one step.

* * * * *